United States Patent [19]

Pechar

[11] Patent Number: 4,583,011

[45] Date of Patent: Apr. 15, 1986

[54] CIRCUIT TO PREVENT PIRATING OF AN MOS CIRCUIT

[75] Inventor: Henry Pechar, Bayville, N.Y.

[73] Assignee: Standard Microsystems Corp., Hauppauge, N.Y.

[21] Appl. No.: 547,639

[22] Filed: Nov. 1, 1983

[51] Int. Cl.[4] .......................................... H03K 19/094

[52] U.S. Cl. .................................. 307/440; 307/450; 307/468

[58] Field of Search .................. 307/200 R, 440, 445, 307/448, 450, 465, 468, 469; 340/825.3, 825.31

[56] References Cited

U.S. PATENT DOCUMENTS 4,084,105 4/1978 Teranishi et al. ............... 307/468 X
4,409,434 10/1983 Basset et al. .................... 307/468 X
4,482,822 11/1984 Kamuro et al. ..................... 307/468
4,495,427 1/1985 Cartwright, Jr. ............... 307/450 X

*Primary Examiner*—Stanley D. Miller
*Assistant Examiner*—D. R. Hudspeth
*Attorney, Agent, or Firm*—Hopgood, Calimafde, Kalil, Blaustein & Judlowe

[57] ABSTRACT

A method and circuit arrangement are disclosed for foiling an attempt to copy an MOS integrated circuit by implementing in the circuit an additional pseudo MOS device, which from its location in the circuit would appear to a would-be copier to be an enhancement-mode device. However, the pseudo-auxiliary MOS device is implemented as a depletion-mode device and is connected in the circuit so that when it is implemented by the copier as an enhancement-mode device. the overall circuit will not be functional.

3 Claims, 3 Drawing Figures

CIRCUIT TO PREVENT PIRATING OF AN MOS CIRCUIT

The present invention relates generally to MOS integrated circuits, and more particularly to a circuit and method for its fabrication for foiling attempts to copy the design of an MOS integrated circuit.

Semiconductor manufacturers commonly expend great resources and efforts in designing and developing new MOS integrated circuits. However, when a new MOS integrated circuit achieves a measure of commercial success, it is not uncommon for a competitor to attempt to duplicate the design simply by photographically copying the chip layout, thereby enabling the copier to bring a competing product on the marketplace without expending any of the effort and expense that the original designer had put into its earlier design efforts.

One known method of foiling a would-be copier or pirate of an integrated circuit is to cover the chip in which the integrated circuit is fabricated with an opaque coating to prevent the underlying circuit from being photographed. This, however, requires an additional processing step for the fabrication of the chip, and, in addition, the coating can be chemically removed by the copier. For these reasons, copiers of novel and successful designs of MOS integrated circuits are, subject only to applicable copyrights and patents, able to copy any integrated circuit design they may wish to.

It is accordingly an object of the present invention to provide an MOS integrated circuit and method for its fabrication which effectively and reliably frustrates the copying of the circuit.

It is a further object of the invention to provide an MOS integrated circuit and a method for its fabrication in which means are provided to prevent the circuit from being copied and which does not require any additional processing steps in its fabrication.

In accordance with the present invention, a circuit and a method for its fabrication are provided in which an additional MOS device or circuit, hereinafter designated as either a pseudo-MOS device or circuit, is incorporated with and connected to a valid logic circuit in an MOS integrated circuit. The pseudo-MOS device or circuit, which has no other function in the overall integrated circuit to which it is added other than to foil the copying of the circuit, is of the type that would generally be recognized by a would-be copier as one that is typically implemented as a depletion-mode (or enhancement-mode) device. In the circuit of the invention the pseudo-MOS device is instead implemented in the contrary mode, that is, an enhancement-mode device would be implemented as a depletion-mode device, and vice versa as the case. Thus, when the would-be pirate attempts to copy an MOS integrated circuit including the pseudo-MOS device or circuit, as in the present invention, he will implement the pseudo-MOS device in the typical way, which, under these circumstances, will cause the circuit to operate improperly or to be non-functional, thereby to foil and frustrate the copier who would be thereafter unable to readily isolate the cause of the circuit's malfunctioning.

To the accomplishment of the above and such further objects as may hereinafter appear, the present invention relates to an MOS integrated circuit and method for its fabrication for preventing the copying of the circuit, substantially as defined in the appended claims and as described in the following description of several presently preferred embodiments of the invention, as considered with the accompanying drawings in which:

In accordance with the present invention an additional or pseudo-MOS device or circuit is added to an integrated circuit, which is to be protected against copying. The pseudo-MOS device is given a selective depletion implant, which is not readily visible on the chip, at a device location which a would-be copier would assume, from the nature of the circuit, would not require a depletion implant; that is, the copier would normally infer that the pseudo-MOS device is an enhancement-mode device. By copying the pseudo-MOS device or circuit without the depletion implant at that device, the operation of the resulting overall circuit will be logically incorrect and thus nonfunctional.

Figure 1:
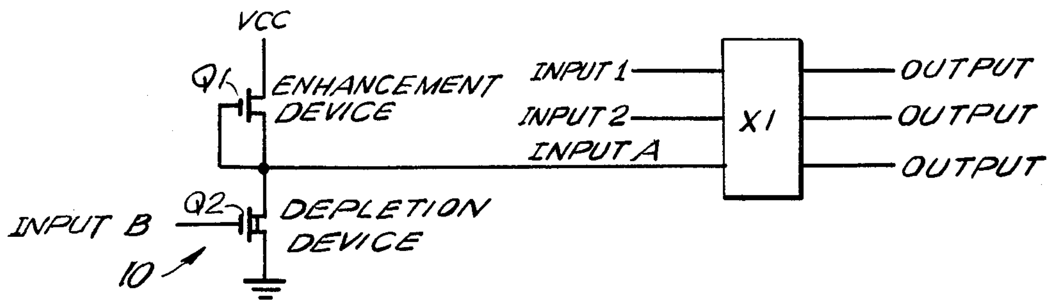
FIG. 1 is a schematic diagram of an MOS integrated circuit illustrating the principles of the present invention.

This principle is illustrated in the circuit of FIG. 1, in which the integrated logic circuit to be protected against copying is designated as Xl. Circuit Xl may be, for example, a logic element, programmable logic array (PLA) or a read-only memory (ROM). In addition to the inputs 1 and 2, which it would normally receive, circuit Xl is also provided with an additional input, input A, derived from an additional or pseudo-circuit 10.

In the embodiment of FIG. 1, circuit Xl is configured in a manner such that if at any time input A is at a logic 1 level, the output of circuit Xl will go to an incorrect state, thereby making the output of circuit Xl invalid. This logic condition of circuit Xl can be satisfied in many conventional ways by the logic designer of ordinary skill in the art depending on the desired logic configuration of the circuit.

Thus, for circuit Xl to operate properly, input A must never become a logic 1. This condition can be satisfied by configuring the pseudo-circuit 10, as shown in FIG. 1, as an inverter comprising an upper or load MOS device Q1 and a lower or pull-down MOS device Q2, which, for all input conditions, has an output at a logic 0 level. In the pseudo-inverter circuit 10 of FIG. 1, this can be accomplished by not applying a depletion implant to the normally depleted load MOS device Q1 and by applying a depletion implant to the normally implanted pull-down device Q2. This will have the effect of the depletion MOS device Q2 being always on and the load enhancement device Q1 being always off irrespective of the logic level of the input B applied to the gate of MOS device Q2, so long as the bottom device Q2 is of any configuration in which a path to ground exists through a depletion-mode device. As a result, the output level of pseudo-inverter 10, and thus the level of input A to circuit X1, is always a logic 0, whereby the operation of circuit X1 will be valid and unaffected by the operation of the additional pseudo-circuit 10, if implemented in the manner described.

Thus, in the integrated circuit, of FIG. 1, which contains the circuit X1 and the pseudo-circuit 10, the operation of the logic circuit of concern, here circuit X1, is independent of the operation of the pseudo-circuit 10 so long as the MOS devices of circuit 10 are implemented in the manner described, that is, with MOS device Q1 as an enhancement-mode device and MOS device Q2 as a depletion mode device. However, a copier of this circuit would not realize or suspect that inverter 10 was anything other than an integral portion of the circuit and would thus copy it along with the remainder of the integrated circuit, here circuit X1. Moreover, the copier recognizing that circuit 10 was an inverter, would, as is conventional in fabricating an inverter, implement MOS device Q1 as a depletion-mode device and MOS device Q2 as an enhancement-mode device, contrary to their mode of implementation, as described above, in a circuit fabricated in accordance with this invention. When the pseudo-inverter 10 is implemented by the copier in this fashion, the output of the inverter could then rise to a logic 1 level, which, as noted above, would cause circuit X1 to be not functional.

It will thus be understood that one who copies the circuit of FIG. 1, but who follows normal expected implementation of the pseudo-inverter circuit 10, would end up with a nonfunctional circuit, which could only be made functional by the unlikely event of the copier's realizing that the MOS devices in the pseudo-inverter had been implemented in a way that, although conventional and normal, their operation was causing the incorrect operation of the circuit. The copier's attempt to copy the MOS integrated circuit would thus have been effectively frustrated.

Figure 2:
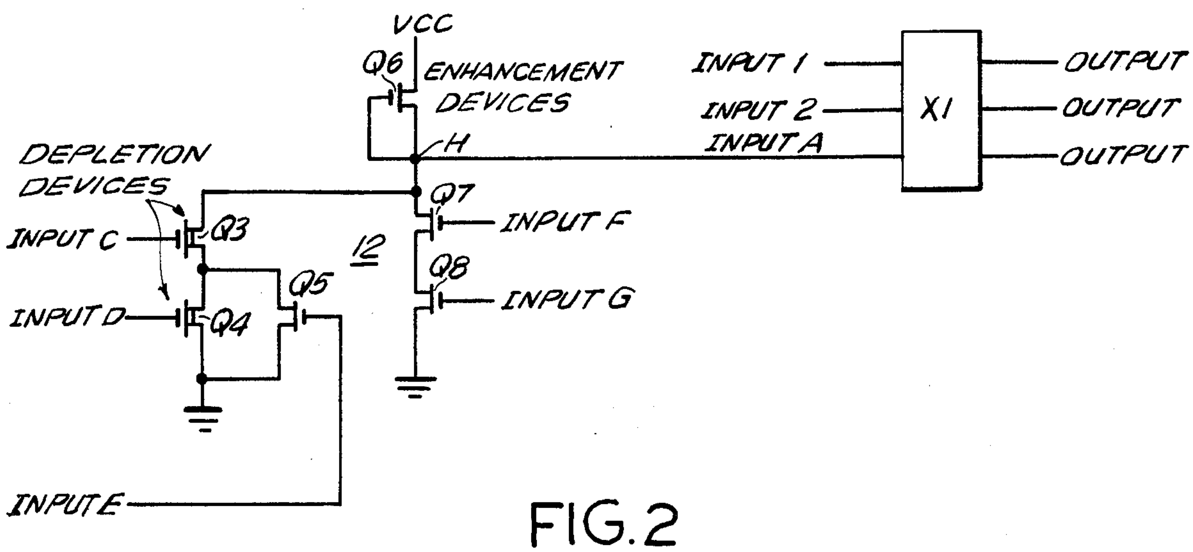
FIG. 2 is a schematic diagram of a more complex implementation of the circuit of the present invention.

Another version of a circuit that can be used to prevent copying in accordance with the invention is shown in FIG. 2, in which circuit X1, as in the embodiment of FIG. 1, is logically inoperative whenever input A is at a logic 1 level. In the embodiment of FIG. 2, the pseudo-circuit, generally designated 12, includes a pair of depletion-mode MOS devices Q3 and Q4, which respectively receive inputs C and D at their gates, and an enhancement-mode MOS device Q5 receiving an input E at its gate. The source terminal of device Q3 is connected to the junction between enhancement-mode MOS devices Q6 and Q7, the latter being in series connection with an enhancement-mode device Q8 and ground. The gate of MOS device Q6 is connected to the output node H at which input A to circuit X1 is produced, whereas the gates of MOS devices Q7 and Q8 respectively receive inputs F and G. In this configuration of the pseudo-circuit the output at node H is always at the logic 0 level.

As in the prior embodiment, MOS devices Q3–Q8 in the pseudo-circuit of FIG. 2 are implemented in a manner opposite to that which the would-be copier would normally do; that is, one recognizing the configuration of the pseudo-circuit 12 in FIG. 2 would instead form MOS devices Q3 and Q4 as enhancement-mode devices and MOS devices Q5–Q8 as depletion-mode devices. Significantly, when the copier implements the MOS devices Q3–Q8 in the "normal" or typical manner as either depletion- or enhancement-mode devices, as the case may be, the signal at output node H is allowed to rise to a logic 1 level, which, as noted, would render logic circuit X1 nonfunctional and would thus frustrate the copying of the circuit.

Figure 3:
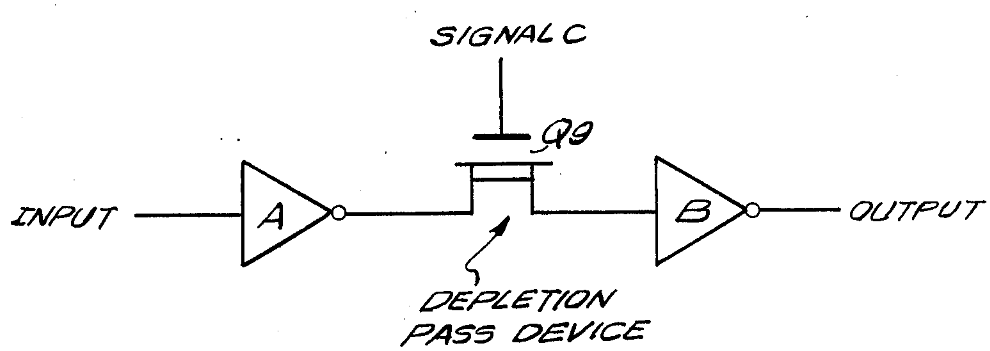
FIG. 3 is a schematic diagram illustrating an alternative implementation of the circuit of the invention.

Another protective circuit embodying the principles of this invention is illustrated in FIG. 3, in which the source-drain path of a pseudo-pass MOS device Q9 is arranged between logic elements, here shown as amplifier-inverters A and B, which are, in turn, connected between an input and an output. When MOS device Q9 is implemented, as shown in FIG. 3, as a depletion-mode device it will conduct or pass the signal between the output of inverter A to the input of inverter B irrespective of the logic level of signal C applied to the input of MOS device Q9; that is, as if no MOS device were present between the inverters.

However, if the circuit of FIG. 3 were to be copied, the copier, not realizing the true purpose of MOS device Q9, would normally and most likely implement the MOS device as a true pass device and would thus implement MOS device Q9 as an enhancement-mode pass device. This would result in the signal from inverter A being transmitted to inverter B only when signal C is a logic 1. This change in signal timing, which would interrupt the signal transmission between inverters A and B, would alter the circuit logic timing sufficiently so as to render the circuit inoperative.

It will thus be appreciated that the present invention has provided an effective way to foil a copier of an MOS integrated circuit by rendering the copied circuit nonfunctional and thus of no use to the copier. It will also be appreciated that whereas the present invention has been specifically described with respect to several presently preferred embodiments thereof, variations and modifications may be made thereto without necessarily departing from the spirit and scope of the invention.

What is claimed is:

1. An MOS integrated circuit comprising a logic element having a plurality of inputs and an additional input and at least one pseudo MOS circuit having an output connected to said additional input, said pseudo MOS circuit comprising a first plurality of depletion-mode MOS devices, and a second plurality of enhancement-mode MOS devices having a node connected to said first plurality of depletion-mode MOS devices and to the additional input of said logic element, whereby said first and second plurality of MOS devices form a circuit of a recognizable configuration in which said first plurality of MOS devices are normally enhancement-mode devices and said second plurality of MOS devices are normally depletion-mode devices, the signal applied to said additional input by said pseudo MOS circuit being effective when at a predetermined first logic level to cause said logic element to be logically nonfunctional but having no effect upon the operation of said logic element when at a second logic level, said pseudo MOS circuit being capable of producing an output at said first logic level, whereby said pseudo MOS circuit causes the integrated circuit to be nonfunctional.

2. The MOS integrated circuit of claim 1, in which said pseudo MOS circuit is an inverter circuit having an upper load MOS device implemented as an enhancement-mode device and a lower pull-down MOS device implemented as a depletion-mode MOS device.

3. An MOS integrated circuit including a logic element and a pseudo MOS device connected to an input of said logic element, said pseudo MOS device defining a recognizable logic device but implemented as an enhancement- or depletion-mode device in a manner opposite so that in which that logic device is normally implemented, said pseudo MOS device when implemented in such opposite manner causing the logically incorrect operation of said logic element, whereby a copied version of the integrated circuit in which said pseudo MOS device is implemented in such normal manner will be logically nonfunctional and inoperative.

* * * * *